US012519435B2

United States Patent
Nguyen et al.

(10) Patent No.: US 12,519,435 B2
(45) Date of Patent: Jan. 6, 2026

(54) ADAPTIVE TEMPERATURE PEAKING CONTROL FOR WIDEBAND AMPLIFIERS

(71) Applicant: MACOM Technology Solutions Holdings, Inc., Lowell, MA (US)

(72) Inventors: Duy P. Nguyen, San Jose, CA (US); Nguyen L. K. Nguyen, San Jose, CA (US); Thanh T. Pham, San Jose, CA (US); Trong Phan, Garden Grove, CA (US); Stefano D'Agostino, Los Altos, CA (US); Wayne Kennan, Palo Alto, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 525 days.

(21) Appl. No.: 18/048,225

(22) Filed: Oct. 20, 2022

(65) Prior Publication Data

US 2024/0136987 A1 Apr. 25, 2024
US 2024/0235501 A9 Jul. 11, 2024

(51) Int. Cl.
*H03G 3/30* (2006.01)
*H03F 3/45* (2006.01)

(52) U.S. Cl.
CPC .......... *H03F 3/4508* (2013.01); *H03G 3/30* (2013.01); *H03F 2200/447* (2013.01); *H03F 2200/468* (2013.01); *H03G 2201/103* (2013.01)

(58) Field of Classification Search
CPC ........... H03F 3/4508; H03F 2200/447; H03F 2200/468; H03F 1/302; H03F 3/245;

(Continued)

(56) References Cited

U.S. PATENT DOCUMENTS 6,194,968 B1 * 2/2001 Winslow ............... H03F 3/195
    330/285
6,559,722 B1 * 5/2003 Lopez .................. H03F 1/301
    330/296

(Continued)

FOREIGN PATENT DOCUMENTS

| JP | H10221385 A | 8/1998 |
| JP | 2003198294 A | 7/2003 |
| JP | 2020107921 A | 7/2020 |

OTHER PUBLICATIONS

International Search Report and Written Opinion for PCT/US23/76684 mailed Jan. 16, 2024.

*Primary Examiner* — Khanh V Nguyen
(74) *Attorney, Agent, or Firm* — Perilla Knox & Hildebrandt LLP; Jason M. Perilla

(57) ABSTRACT

Amplifiers with temperature-adaptive gain and peaking gain control are described. In one example, a temperature-adaptive amplifier includes an amplifier, a temperature sense circuit, and a peaking control level shifter to bias shift the output of the amplifier and adjust a peaking gain of the amplifier based on the temperature control signal. The peaking control level shifter can adjust a peaking gain of the amplifier based on the temperature control signal. The temperature-adaptive control can help to compensate for peaking gain in amplifiers based on the operating temperature of the amplifier. The control can help to compensate for unwanted changes in amplifier peaking gain, over time, resulting in more consistent peaking gain over the full operating frequency range of amplifiers.

20 Claims, 9 Drawing Sheets

(58) Field of Classification Search
CPC .... H03F 1/30; H03F 3/45479; H03F 3/45071; H03F 3/45085; H03G 3/30; H03G 2201/103
USPC ........................................ 330/256, 272, 289
See application file for complete search history.

(56) References Cited

U.S. PATENT DOCUMENTS

| | | | |
|---|---|---|---|
| 6,958,649 B2 * | 10/2005 | Nagamori | H03G 3/3042 330/285 |
| 7,656,233 B2 * | 2/2010 | Lee | H03F 1/301 330/296 |
| 2020/0076374 A1 | 3/2020 | Akhtar et al. | |
| 2022/0149789 A1 * | 5/2022 | Balboni | H03F 1/30 |

* cited by examiner

ADAPTIVE TEMPERATURE PEAKING CONTROL FOR WIDEBAND AMPLIFIERS

BACKGROUND

An amplifier is an electronic device or circuit designed to provide an amplified output signal with respect to an input signal. The gain of an amplifier can be defined as the ratio between the magnitudes of the output and input signals of the amplifier, and gain can be unitless and expressed in decibels. Amplifiers are often designed to have linear gain over a certain operating frequency range or bandwidth, although amplifiers can also be designed to achieve a range of different performance characteristics depending upon the application. Other characteristics of amplifiers can be defined according to other input and output characteristics, small signal parameters, scattering parameters, and other operating characteristics.

Transistors are commonly used as amplifiers or as parts of amplifier circuits. A transistor, such as a bipolar junction transistor (BJT), can be configured as a certain type or class of amplifier based on which terminal of the transistor is common to both the input and the output of the transistor. In the case of bipolar junction transistors, the amplifier classes include common emitter, common base, and common collector. For field-effect transistors (FETs), the amplifier classes include common source, common gate, and common drain.

SUMMARY

Various aspects of temperature-adaptive peaking control for amplifiers are described. The temperature-adaptive peaking control can compensate for peaking gain in an amplifier based on the operating temperature of the amplifier. The control can help to compensate for unwanted changes in amplifier gain based on the operating temperature of the amplifier, over time, resulting in more consistent gain over the full operating frequency range of the amplifier. The peaking control can also help to compensate for non-linear gain shape across a range of operating frequencies and temperatures in amplifiers.

In one example, a semiconductor device with temperature-adaptive control includes an amplifier to provide an amplified output signal, a temperature sense circuit to provide a temperature control signal based on an operating temperature of the amplifier, and a peaking control level shifter to bias shift the output of the amplifier and to adjust a gain of the amplifier based on the temperature control signal. More particularly, the peaking control level shifter can adjust a peaking gain of the amplifier based on the temperature control signal.

In one example, the semiconductor device can include a converter to convert a temperature reference voltage to a temperature reference current. The converter and the peaking control level shifter can be embodied as a current mirror in one example. In that case, the peaking control level shifter mirrors the temperature reference current to adjust the gain or peaking gain of the amplifier. In one case, the peaking control level shifter includes an emitter follower transistor to bias shift the output of the amplifier, and a transistor having a base coupled to the converter to mirror the temperature reference current.

According to aspects of the embodiments, the temperature sense circuit includes a temperature dependent impedance network to provide a temperature profile voltage based on the operating temperature of the amplifier, and a difference amplifier to provide the temperature control signal based on the temperature profile voltage. The temperature sense circuit can also include a resistor voltage divider coupled between an output of the difference amplifier and an input of the difference amplifier, and a reference generator to provide a reference voltage to the resistor voltage divider. In this example, the reference voltage sets a scale position of the temperature profile of the temperature sense circuit, and the resistor voltage divider sets a slope of a temperature profile of the temperature sense circuit.

In some cases, the amplifier includes a variable gain amplifier. The amplifier can also include a differential variable gain amplifier. In that case, the peaking control level shifter can be embodied as a differential peaking control level shifter.

In other examples, the semiconductor device can also include a second amplifier, a second temperature sense circuit to provide a second temperature control signal based on an operating temperature of the second amplifier, and a second peaking control level shifter. The second peaking control level shifter can bias shift an output of the second amplifier and adjust a gain or peaking gain of the second amplifier based on the second temperature control signal. In this case, the peaking control level shifter can be coupled between the amplifier and the second amplifier, and the second peaking control level shifter can be coupled between the second amplifier and an output of the semiconductor device.

In another example, a multi-stage semiconductor device with temperature-adaptive control includes a first amplifier, a second amplifier, a temperature sense circuit to provide a temperature control signal, and a peaking control level shifter coupled between an output of the first amplifier and an input of the second amplifier. The peaking control level shifter adjusts a peaking gain of the multi-stage semiconductor device based on the temperature control signal.

The multi-stage semiconductor device can also include a converter to convert a temperature reference voltage to a temperature reference current, and the peaking control level shifter mirrors the temperature reference current to adjust the peaking gain of the multi-stage semiconductor device. The converter and the peaking control level shifter can be embodied as a current mirror in one example. In that case, the peaking control level shifter mirrors the temperature reference current to adjust the gain or peaking gain of the amplifier. In one case, the peaking control level shifter includes an emitter follower transistor to bias shift the output of the amplifier, and a transistor having a base coupled to the converter to mirror the temperature reference current.

BRIEF DESCRIPTION OF THE DRAWINGS

Aspects of the present disclosure can be better understood with reference to the following drawings. It is noted that the elements in the drawings are not necessarily drawn to scale, with emphasis instead being placed upon illustrating the principles of the examples. In the drawings, like reference numerals designate like or corresponding, but not necessarily the same, elements throughout the several views.

DETAILED DESCRIPTION

A number of amplifier characteristics can be defined according to the input and output characteristics, small signal parameters, scattering parameters, and other operating characteristics of the amplifier. The design of an amplifier typically includes an evaluation of a number of operating characteristics of the amplifier, such as the linearity, operating bandwidth, small signal parameters, and other operating characteristics of the amplifier. In one approach, an amplifier circuit network can be modeled as a "black box" containing a variety of interconnected circuit components or lumped elements, such as resistors, capacitors, inductors, and transistors, which interact with other circuits through ports. The amplifier circuit network can be characterized by complex numbers called the S-parameters, which can be used to calculate the response of the amplifier to signals applied to the ports. The S-parameters of an amplifier are related to the electrical behavior of the amplifier over a range of input signals. The gain, return loss, voltage standing wave ratio (VSWR), reflection coefficient, and amplifier stability of an amplifier circuit network can be expressed using the S-parameters among other operating parameters.

The gain of an amplifier over an operating frequency range or bandwidth of the amplifier is an important operating characteristic for many amplifier applications. The gain of an amplifier can vary based on the power, temperature, bandwidth, and other operating characteristics, and it can be important to evaluate the gain of an amplifier for many applications, particularly if the amplifier is intended for use over a wide operating bandwidth. Some applications rely upon wideband amplifiers capable of amplifying signals that range from about 1 GHz or lower to 70 GHz or higher. Peaking gain can be defined as the difference between the gain of an amplifier when amplifying high frequency signals as compared to the gain of the amplifier when amplifying low frequency signals.

In the context outlined above, aspects of temperature-adaptive peaking control for amplifiers are described herein. The temperature-adaptive peaking control can compensate for peaking gain in an amplifier based on the operating temperature of the amplifier. The control can help to compensate for unwanted changes in amplifier gain based on the operating temperature of the amplifier, over time, resulting in more consistent gain over the full operating frequency range of the amplifier. The peaking control can also help to compensate for non-linear gain shape across a range of operating frequencies and temperatures in amplifiers.

Figure 1:
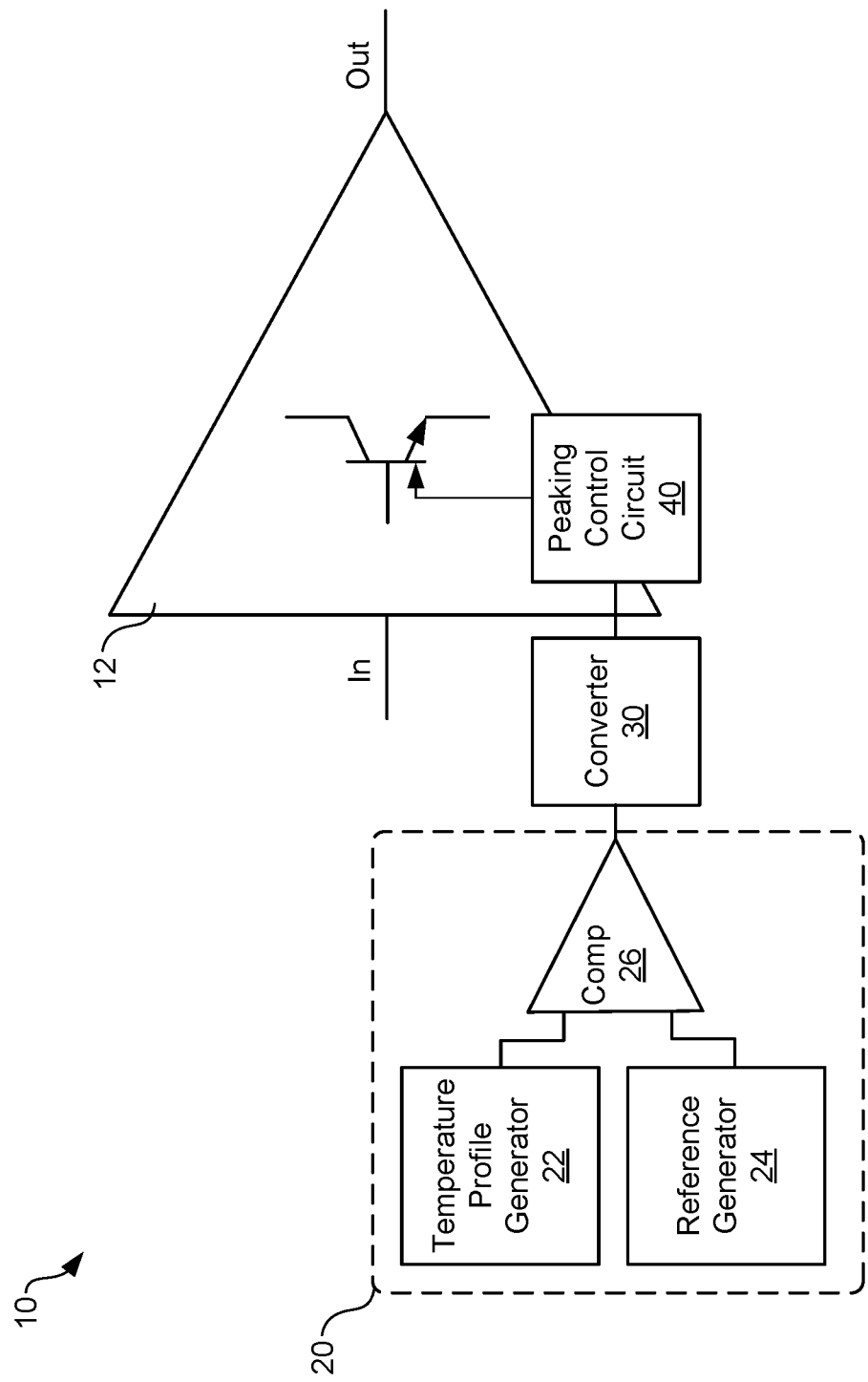
FIG. 1 illustrates an example amplifier with temperature-adaptive peaking control according to certain aspects of the concepts described herein.

Turning to the drawings, FIG. 1 illustrates an example amplifier 10 with temperature-adaptive peaking control according to certain aspects of the concepts described herein. The amplifier 10 is a single stage amplifier and provided as a representative example of one type of an amplifier in which the concepts of temperature-adaptive peaking control can be implemented as described herein. The concepts can be applied to other types of amplifiers, however. The illustration of the amplifier 10 in FIG. 1 is not exhaustive, and the amplifier 10 can include other components that are not illustrated. Additionally, in some cases, one or more of the components shown in FIG. 1 can be omitted.

Among other components, the amplifier 10 includes a power amplifier 12, a temperature sense circuit 20, a converter 30, and a peaking control circuit 40. The amplifier 10 is designed to amplify an input signal provided at the input terminal In and provide an amplified output signal at the output terminal Out, as shown in FIG. 1. The amplifier 10 can be designed to provide gain over a frequency range of the input signal from nearly zero to 50 GHz, 60 GHz, 70 GHz, 80 GHz, or more, although the concepts described herein are not limited to amplifiers operating at any particular range of operating frequencies.

The amplifier 10 and other amplifiers described herein can be implemented in various ways, such as an integrated circuit device formed on a semiconductor substrate, discrete components, or a combination of discrete components and integrated circuits. In some cases, the amplifier 10 can be implemented or simulated on one or more computing devices. For example, one or more aspects of a semiconductor manufacturing process, such as the dopant distribution, the stress distribution, the device geometry, and other aspects of a manufacturing process to form the amplifier 10 can be simulated. Manufacturing process simulations can be relied upon to model the characteristics of the semiconductor devices (e.g., transistors) and other elements (e.g., resistors, inductors, capacitors, etc.) of the amplifier 10. One or more operational characteristics of the amplifier 10, such as the gain-bandwidth, stability, and other characteristics can also be simulated. Simulations can be relied upon to model the characteristics of the semiconductor devices (e.g., transistors) and other elements (e.g., resistors, inductors, capacitors, etc.) of the amplifier 10. Thus, the amplifier 10 can be simulated using one or more circuit simulator, semiconductor device modeling, semiconductor process simulation, or related Technology Computer Aided Design (TCAD) software tools.

The power amplifier 12 is configured to amplify the input signal provided at the input terminal In and provide an amplified output signal at the output terminal Out, as shown in FIG. 1. The power amplifier 12 can be embodied by one or more power transistors implemented in Silicon Germanium (SiGe) semiconductor materials in one example. However, other semiconductor materials and processes can be relied upon for the power transistors of the power amplifier 12.

As noted above, the power amplifier 12 is designed to amplify input signals over a relatively wide range of frequencies and, as such, is referenced as a wideband amplifier. The operating characteristics of the power amplifier 12 can be sensitive to the characteristics of the input signals being amplified. For example, the power amplifier 12 can exhibit relatively higher gain for input signals at higher frequencies and relatively lower gain for input signals at lower frequencies. The operating characteristics of the power amplifier 12 can also be sensitive to the operating environment of the power amplifier 12. For example, the gain of the power amplifier 12 can be sensitive to the operating temperature of the power amplifier 12. The power amplifier 12 may also experience a confluence of higher operating temperatures when amplifying input signals of relatively higher frequencies, which can also lead to higher gain for input signals at higher frequencies.

Figure 3:
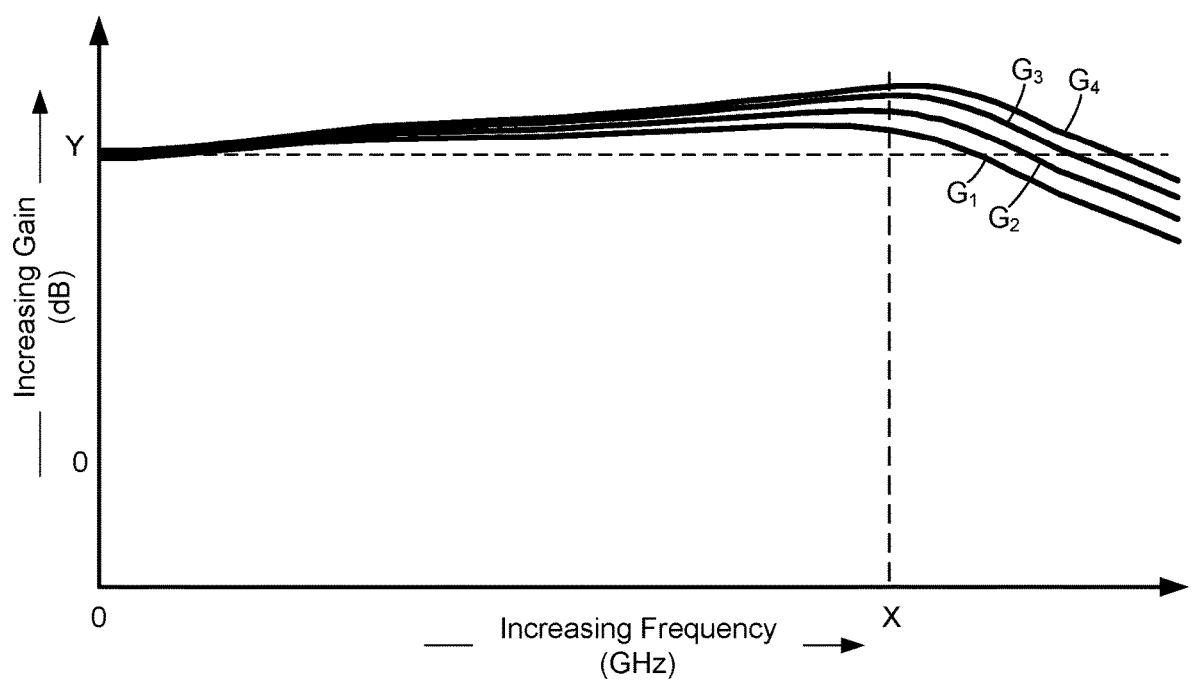
FIG. 3 illustrates a representative plot of power gain, across operating frequency, of the multi-stage amplifier shown in FIG. 2 according to certain aspects of the concepts described herein.

The gain of the power amplifier 12 over a relatively wide operating frequency range is an important operating characteristic for many applications. Overall, the peaking gain of the power amplifier 12 can be defined as the difference between the gain of the power amplifier 12 when amplifying high frequency signals as compared to the gain of the power amplifier 12 when amplifying low frequency signals. An example of peaking gain is illustrated in FIG. 3 and described below.

According to aspects of the embodiments, the amplifier 10 incorporates temperature-adaptive gain and peaking gain control. The temperature-adaptive control helps to maintain a more consistent gain for the power amplifier 12 over the full operating frequency and temperature range of the power amplifier 12. In one aspect, the temperature-adaptive peaking control reduces the peaking gain of the power amplifier 12. The temperature-adaptive peaking control is facilitated by the temperature sense circuit 20, the converter 30, and the peaking control circuit 40, as described herein.

The temperature sense circuit 20 includes a temperature profile generator 22, a reference generator 24, and a comparator 26, among possibly other components. The temperature sense circuit 20 provides a temperature control signal as an output, based on an operating temperature of the amplifier 10. The temperature control signal is representative of the operating temperature of the amplifier 10. For example, a voltage or potential of the temperature control signal can be representative of the operating temperature of the amplifier 10, where a higher voltage potential is representative of a higher operating temperature and a lower voltage potential is representative of a lower operating temperature. In other cases, a lower voltage potential can be representative of a higher operating temperature and a higher voltage potential can be representative of a lower operating temperature. The temperature control signal is provided as an input to the converter 30. An example of the temperature sense circuit 20 is described in additional detail below with reference to FIG. 5.

The converter 30 is configured to convert the temperature control signal from the temperature sense circuit 20 into a peaking control signal for the peaking control circuit 40. As one example, the converter 30 can be implemented as a type of transconductance circuit, capable of converting a voltage of the temperature control signal from the temperature sense circuit 20 into a current for the peaking control circuit 40. An example of the converter 30 is described in additional detail below with reference to FIG. 6.

The peaking control circuit 40 can, in some cases, be implemented as part of the power amplifier 12. For example, the peaking control circuit 40 can be embodied as a buffer or level shifting output stage of the power amplifier 12. The peaking control circuit 40 receives the peaking control signal output from the converter 30 and, in response to the peaking control signal, adjusts the peaking gain of the power amplifier 12. Thus, the power amplifier 12 incorporates aspects of temperature-adaptive peaking control according to the concepts described herein. Overall, the temperature sense circuit 20, converter 30, and peaking control circuit 40 help to reduce the gain or peaking gain of the power amplifier 12 at low temperature and increase the peaking gain of the power amplifier 12 at high temperature. Additional details related to the implementation and effect of the peaking control are described below.

Figure 2:
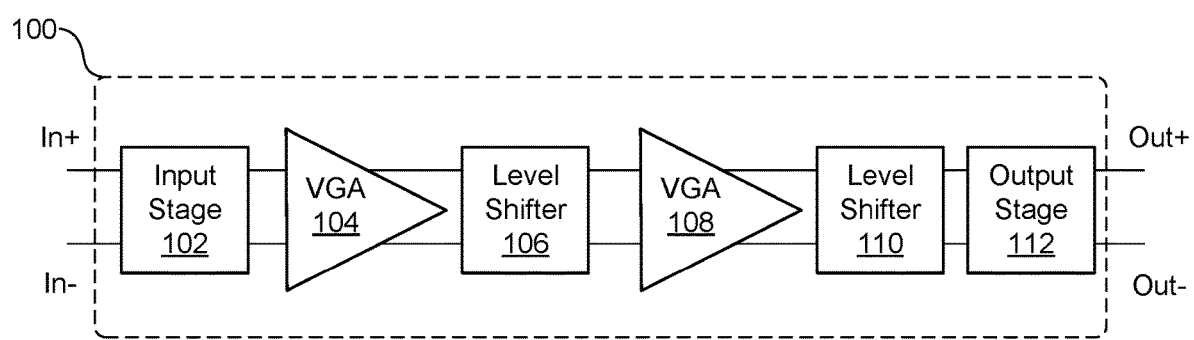
FIG. 2 illustrates an example multi-stage amplifier according to certain aspects of the concepts described herein.

FIG. 2 illustrates an example multi-stage amplifier 100 according to certain aspects of the concepts described herein. The amplifier 100 includes a number of amplifier stages, and two stages are illustrated in FIG. 2. The amplifier 100 is provided as a representative example of one type of an amplifier in which the concepts of temperature-adaptive peaking control can be implemented as described in further detail below herein. The concepts can be applied to other types of amplifiers, including multi-stage amplifiers having additional amplifier stages, such as three, four, or more stages. The number of amplifier stages is not limited, and the concepts of temperature-adaptive peaking control can be applied to amplifiers having any number of stages. The illustration of the amplifier 100 in FIG. 2 is not exhaustive, and the amplifier 100 can include other components that are not illustrated. Additionally, in some cases, one or more of the components shown in FIG. 2 can be omitted in some cases.

Among other components, the amplifier 100 includes an input stage 102, a first variable gain amplifier (VGA) 104, a first level shifter 106, a second VGA 108, a second level shifter 110, and an output stage 112. The amplifier 100 is designed to amplify a differential input signal provided across input terminals In+ and In−, as shown in FIG. 2, and provide an amplified differential output signal at output terminals Out+ and Out−. The amplifier 100 is designed to provide gain over a frequency range of the differential input signal from nearly zero to 50 GHz, 60 GHz, 70 GHz, 80 GHz, or more, although the amplifier 100 is not limited to operating at any particular range of operating frequencies. The amplifier 100 is also designed to operate over a relatively wide range of operating temperatures, such as from −5° C. or lower to 95° C. or greater.

The amplifier 100 and other amplifiers described herein can be implemented in various ways, such as an integrated circuit device formed on a semiconductor substrate, discrete components, or a combination of discrete components and integrated circuits. The amplifier 100 can also be implemented or simulated on one or more computing devices. For example, one or more aspects of a semiconductor manufacturing process, such as the dopant distribution, the stress distribution, the device geometry, and other aspects of a manufacturing process to form the amplifier 100 can be simulated using one or more circuit simulator, semiconductor device modeling, semiconductor process simulation, or related TCAD software tools.

The input stage 102 can be implemented using one or more capacitors or a capacitor network, for example, capable of isolating and coupling the differential input signal of the amplifier 100 to the VGA 104. The input stage 102 can also provide level shifting in some cases and convert impedances from the input of the amplifier 100 to the input of the VGA 104.

The VGA 104 is an amplifier stage and amplifies the differential input signal provided from the input stage 102. The amplified output of the VGA 104 is provided as an input to the level shifter 106. The VGA 104 can be implemented as a differential amplifier stage including one or more bipolar junction transistors (BJTs) in one example. The VGA 108 can also be implemented using other types of transistors in some cases, including field-effect transistors (FETs) and other types of transistors. In some cases, the VGA 104 can be configured to provide a variable gain, to vary the gain characteristics of the amplifier 100 in certain cases. In other cases, the VGA 104 can be implemented as a fixed gain amplifier rather than a variable gain amplifier.

The level shifter 106 can be embodied as a type of output stage and level shifter for the VGA 104. The level shifter 106 can provide impedance buffering and DC bias shifting between the output of the VGA 104 and the input of the VGA 108. In one example, the level shifter 106 can be embodied as an emitter-follower (i.e., common collector) transistor stage in a string with one or more diode-connected transistors, for DC bias shifting and impedance buffering. The level shifter 106 can include a separate emitter-follower string for each of the In+ and In− components of the differential input signal being amplified. The level shifter 106 can also be embodied as other configurations or arrangements of transistors.

Similar to the VGA 104, the VGA 108 is an amplifier stage and amplifies the differential signal provided from the level shifter 106. The amplified output of the VGA 108 is provided as an input to the level shifter 110. The VGA 108 can be implemented as a differential amplifier stage including one or more BJTs in one example, although it can also be implemented using FETs and other types of transistors. In some cases, the VGA 108 can be configured to provide a variable gain, to vary the gain characteristics of the amplifier 100 in certain cases. In other cases, the VGA 108 can be implemented as a fixed gain amplifier.

The level shifter 110 can be embodied as an output stage and level shifter for the VGA 108. The level shifter 110 can provide impedance buffering and DC bias shifting between the output of the VGA 108 and the input of the output stage 112. The level shifter 110 can be embodied as an emitter-follower transistor stage in a string with one or more diode-connected transistors, for DC bias shifting and impedance buffering. The level shifter 110 can include a separate emitter-follower string for each of the In+ and In− components of the differential input signal being amplified. The level shifter 110 can also be embodied as other configurations or arrangements of transistors. The output stage 112 can be implemented using one or more capacitors, inductors, or other matching network, for example, capable of matching the differential output signal of the amplifier 100 to other stages or a load.

With the high gain, wide operating bandwidth, and multi-stage differential amplifier design of the amplifier 100, it can exhibit peaking gain. FIG. 3 illustrates a representative plot of power gain, across operating frequency, of the multi-stage amplifier 100 shown in FIG. 2. In FIG. 3, each of the curves $G_1$-$G_4$ is plotted for a different operating temperature of the amplifier 100, which can vary over time based on the operating environment and other factors for the amplifier 10. Each of the curves $G_1$-$G_4$ illustrates the gain of the amplifier 100 across operating frequency, for a particular temperature. The curve $G_1$ was generated for an operating temperature of 95° C., and the curve $G_4$ was generated for an operating temperature of −5° C. The curves $G_2$ and $G_3$ were generated for operating temperatures between 95° C. and −5° C.

As shown in FIG. 3, starting from a gain of "Y" at a very low frequency, each of the curves $G_1$-$G_4$ increase in gain while approaching the frequency "X." The change in gain from low input frequencies to the frequency "X" is most pronounced for the curve $G_4$, which is associated with the lowest operating temperature among the curves $G_1$-$G_4$. Peaking gain can be defined as the difference between the gain of an amplifier when amplifying high frequency signals as compared to the gain of the amplifier when amplifying low frequency signals. In that context, the amplifier 100 exhibits the largest peaking gain at lower operating temperatures. Other types of power amplifiers, including the power amplifier 12 shown in FIG. 1, may also exhibit larger peaking gain at higher operating temperatures.

Figure 4:
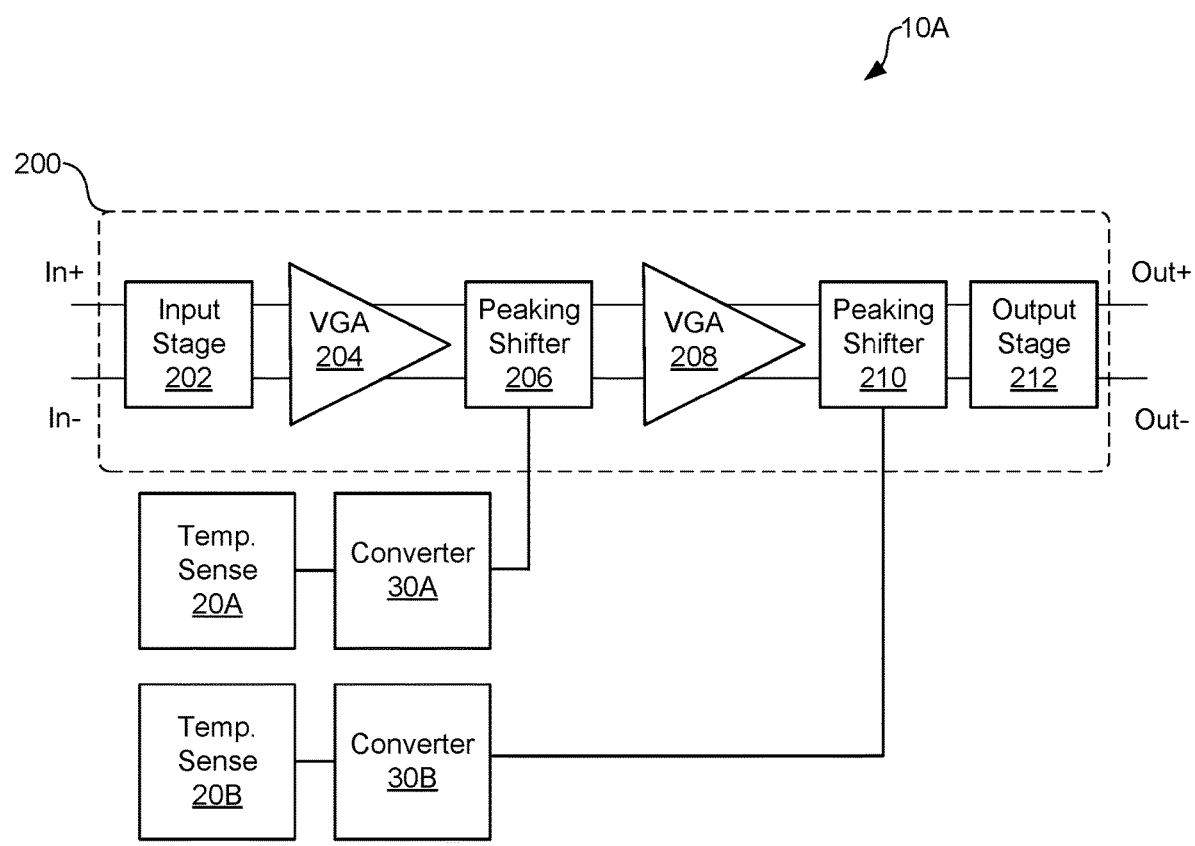
FIG. 4 illustrates an example amplifier with temperature-adaptive peaking control according to certain aspects of the concepts described herein.

Peaking gain of an amplifier may be desirable for some applications or purposes. However, it may be preferable to have little or no (e.g., a flat or consistent) peaking gain variation over the full operating range of an amplifier, regardless of the operating temperature of the amplifier. In that context, FIG. 4 illustrates an example amplifier 10A with temperature-adaptive peaking control. The amplifier 10A includes a multi-stage amplifier 200, a temperature sense circuit 20A, a converter 30A, a temperature sense circuit 20B, and a converter 30B. The amplifier 200 includes an input stage 202, a first VGA 204, a first peaking shifter 206, a second VGA 208, a second peaking shifter 210, and an output stage 212.

Similar to the amplifier 100 shown in FIG. 2, the amplifier 200 is designed to amplify a differential input signal provided across input terminals In+ and In− and provide an amplified differential output signal at output terminals Out+ and Out−. The amplifier 200 can be designed to provide gain over a frequency range of the differential input signal from nearly zero to 50 GHz, 60 GHz, 70 GHz, 80 GHz, or more, although the amplifier 200 is not limited to operating at any particular range of operating frequencies. The amplifier 200 can be implemented as an integrated circuit device formed on a semiconductor substrate, discrete components, or a combination of discrete components and integrated circuits. The amplifier 200 can also be implemented or simulated on one or more computing devices, such as using one or more circuit simulator, semiconductor device modeling, semiconductor process simulation, or related TCAD software tools.

The input stage 202, the VGA 204, the VGA 208, and the output stage 212 of the amplifier 200 shown in FIG. 4 are similar to the input stage 102, the VGA 104, the VGA 108, and the output stage 112 of the amplifier 100 shown in FIG. 2. The peaking shifters 206 and 210 in the amplifier 200 are also similar to the level shifters 106 and 110 in the amplifier 100, although the peaking shifters 206 and 210 also act to provide temperature-adaptive peaking control in the amplifier 200.

Figure 6:
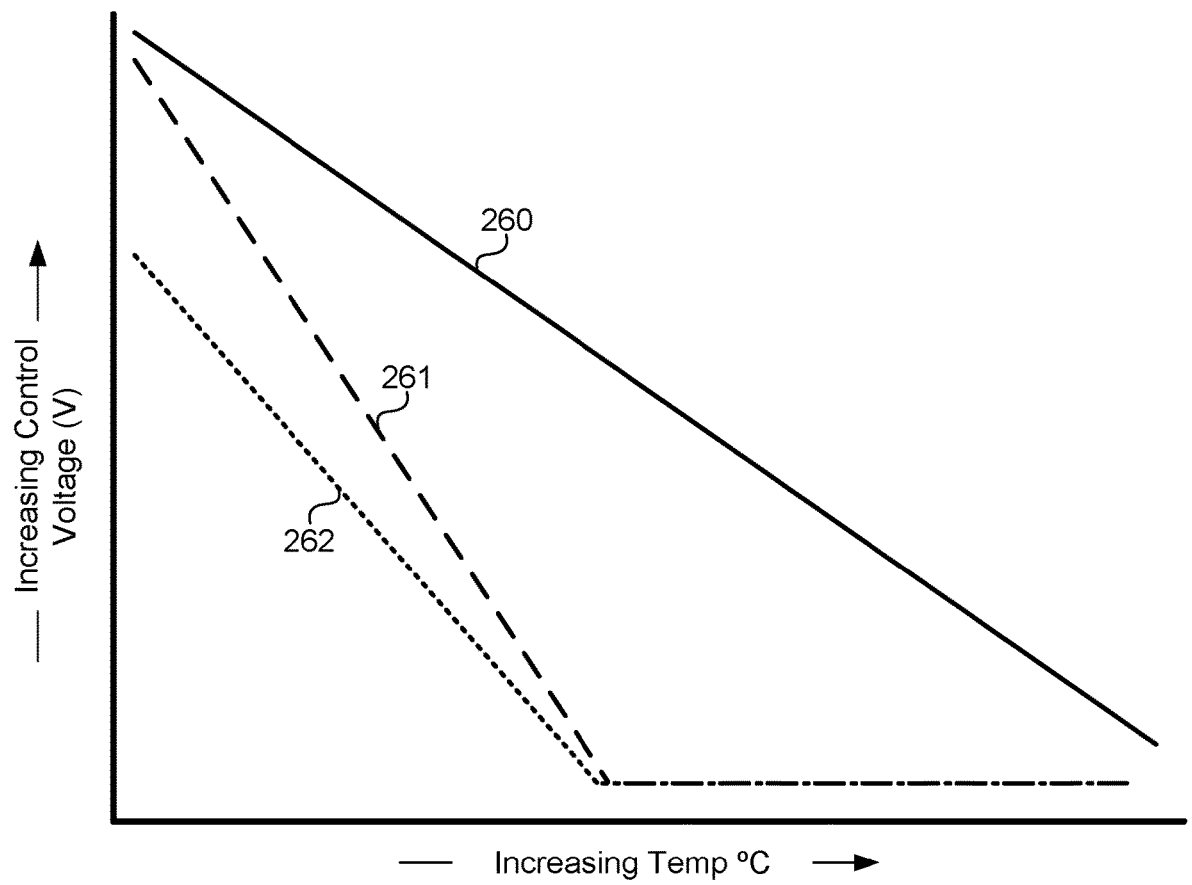
FIG. 6 illustrates example temperature compensation profiles of a temperature sense circuit in the amplifier shown in FIG. 4 according to certain aspects of the concepts described herein.
Figure 7:
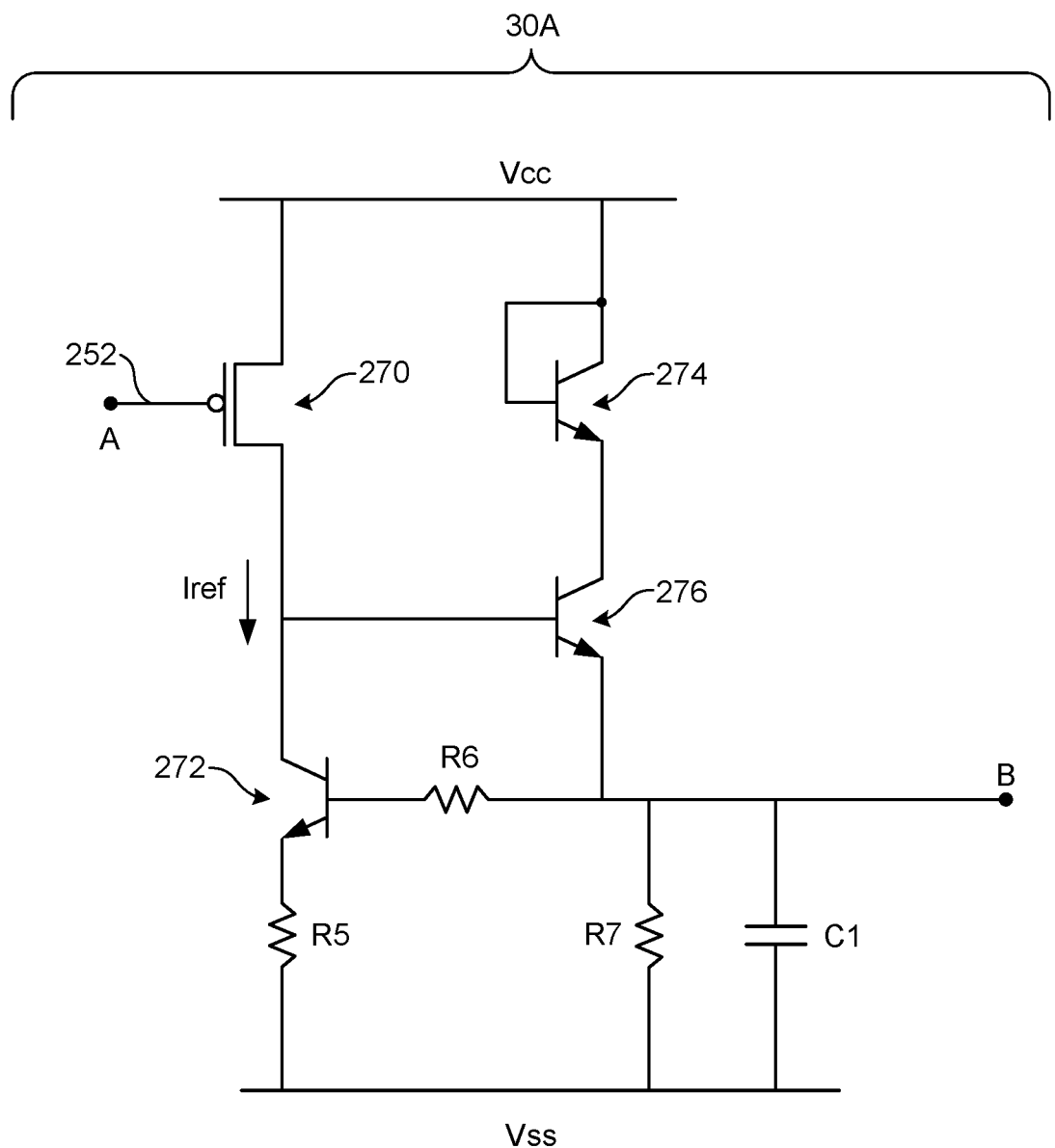
FIG. 7 illustrates a converter in the multi-stage amplifier shown in FIG. 4 according to certain aspects of the concepts described herein.

The peaking shifter 206 can be embodied as a type of output stage and level shifter for the VGA 204. The peaking shifter 206 can provide impedance buffering and DC bias shifting between the output of the VGA 204 and the input of the VGA 208. The peaking shifter 206 can be embodied as an emitter-follower transistor stage in a string with one or more diode-connected transistors, for DC bias shifting and impedance buffering. The peaking shifter 206 can include a separate emitter-follower string for each of the In+ and In− components of the differential input signal being amplified. As compared to the level shifter 106, the peaking shifter 206 also includes circuit components that operate to alter or vary an amount of gain provided based on a peaking control reference provided by the converter 30A. In one example, the emitter-follower transistor stage of the peaking shifter 206 is coupled in a current mirroring arrangement with the converter 30A. A reference current, and gain, of the peaking shifter 206 is directed based on a temperature control signal provided from the temperature sense circuit 20A. An example implementation of the converter 30A is illustrated in FIG. 6 and described below. An example implementation of the peaking shifter 206 is illustrated in FIG. 7 and described below.

The peaking shifter 210 can be embodied as a type of output stage and level shifter for the VGA 208. The peaking shifter 210 can provide impedance buffering and DC bias shifting between the output of the VGA 208 and the input of the output stage 212. The peaking shifter 210 can be embodied as an emitter-follower transistor stage in a string with one or more diode-connected transistors, for DC bias shifting and impedance buffering. The peaking shifter 210 can include a separate emitter-follower string for each of the In+ and In− components of the differential input signal being amplified. As compared to the level shifter 110, the peaking shifter 210 also includes circuit components that operate to alter or vary an amount of gain provided based on a peaking control reference provided by the converter 30B. In one example, the emitter-follower transistor stage of the peaking shifter 210 is coupled in a current mirroring arrangement with the converter 30B, such that the converter 30B and the peaking shifter 210 together form a current mirror. A reference current, and gain, of the peaking shifter 210 is directed based on a temperature control signal provided from the temperature sense circuit 20B. An example implementation of the converter 30B is illustrated in FIG. 6 and described below. An example implementation of the peaking shifter 210 is illustrated in FIG. 7 and described below.

The temperature sense circuit 20A is configured to provide a first temperature control signal representative of an operating temperature of the amplifier 200, such as the temperature at a particular location within the semiconductor die in which the amplifier 200 is implemented. The temperature sense circuit 20B is configured to provide a second temperature control signal representative of an operating temperature of the amplifier 200, such as at another location within the semiconductor die in which the amplifier 200 is implemented. The temperature sense circuits 20A and 20B can be positioned at different locations and measure temperatures separately, to provide separate temperature control signals to the converters 30A and 30B and the peaking shifters 206 and 210, respectively. In some cases, the temperature sense circuits 20A and 20B can be separately tailored to have different response characteristics, for more granular adaptive-temperature peaking control of the amplifier 200. In other cases, one of the temperature sense circuits 20A and 20B and a corresponding one of the converters 30A and 30B can be omitted.

Figure 5:
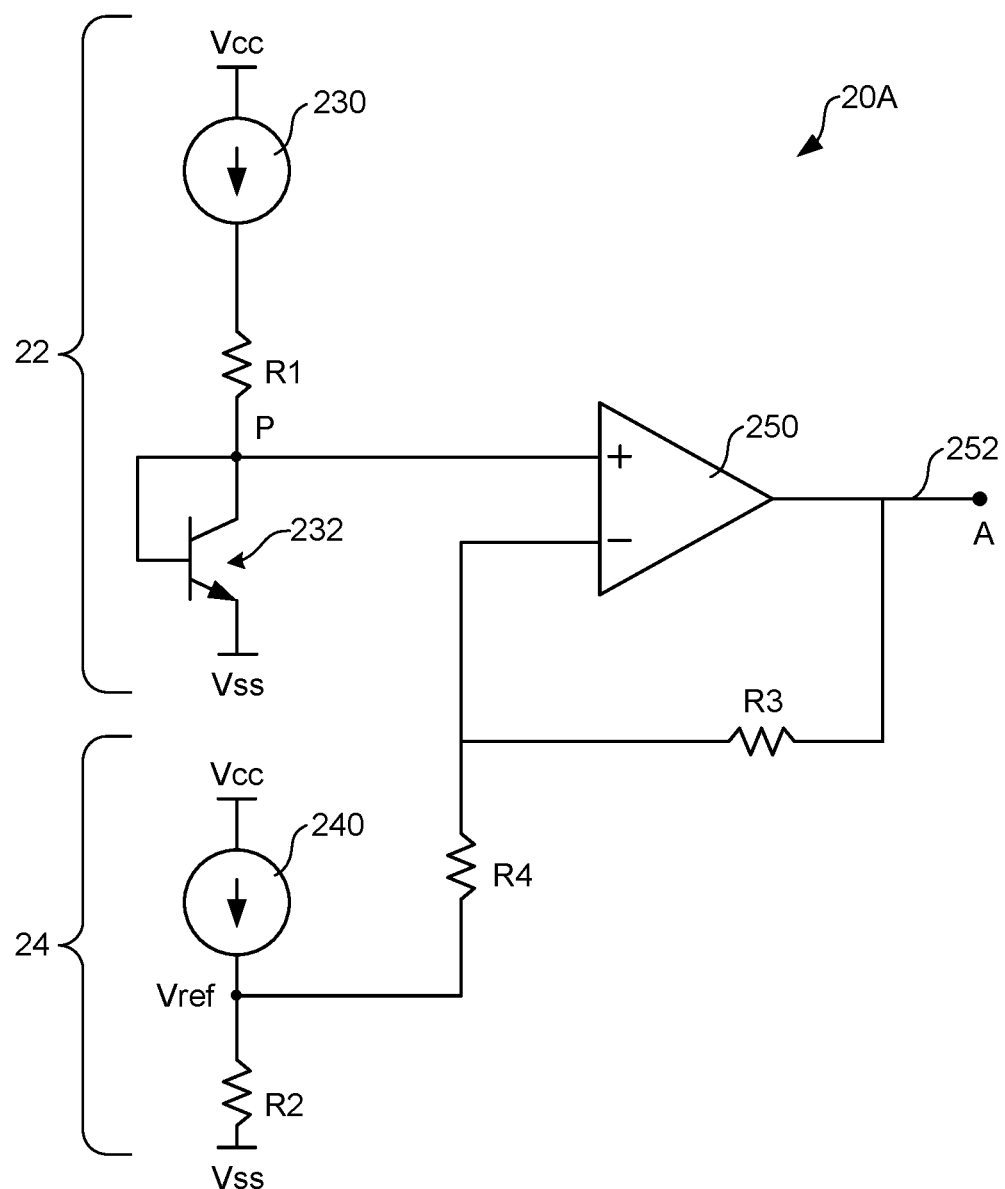
FIG. 5 illustrates a temperature sense circuit in the multi-stage amplifier shown in FIG. 4 according to certain aspects of the concepts described herein.

FIG. 5 illustrates an example of the temperature sense circuit 20A in the amplifier 10A shown in FIG. 4. The configuration of temperature sense circuit 20A is provided as a representative example in FIG. 4. The temperature sense circuit 20A can vary as compared to that shown. For example, the temperature sense circuit 20A can include other components not illustrated or omit some elements in some cases. The temperature sense circuit 20A can also be configured for control that is complementary to the absolute operating temperature of the amplifier 200 or for control that is proportional to the absolute operating temperature of the amplifier 200.

The temperature sense circuit 20A operates as a temperature-dependent control circuit for the amplifier 10A, and it is implemented on the same semiconductor die as the amplifier 200 in one example. In other cases, one or more components of the temperature sense circuit 20A can be implemented off-chip from the semiconductor die that includes the amplifier 200. The temperature sense circuit 20B of the amplifier 200 is similar to the temperature sense circuit 20A and can be implemented in a similar way. Thus, the temperature sense circuit 20B is not separately described with reference to FIG. 5, but the description of the temperature sense circuit 20A is applicable to the temperature sense circuit 20B. While the temperature sense circuit 20A ultimately provides temperature-related feedback to the peaking shifter 206, as shown in FIG. 4, the temperature sense circuit 20B provides temperature-related feedback to the peaking shifter 210.

The temperature sense circuit 20A includes a temperature profile generator 22, a reference generator 24, and a comparator or difference amplifier 250. Overall, the temperature sense circuit 20A generates a temperature-dependent voltage as a temperature control signal 252 provided at the node A, which is provided as an input to the converter 30A shown in FIG. 6. In the temperature profile generator 22, the current source 230 generates a constant (e.g., temperature-invariant) current through a temperature-dependent impedance network, such as a resistor R1 and a diode-connected BJT 232, to generate the temperature profile voltage at the node P. The emitter of the transistor 232 is coupled to Vss or ground in the example shown in FIG. 4, although the transistor 232 can also be coupled to ground through another series-connected resistor in some cases.

The transistor 232 can be formed in relatively close proximity to the VGA 204 on the same semiconductor die as the amplifier 200, for example, although the exact position of the transistor 232 can vary on the semiconductor die. The operating characteristics of the transistor 232 vary based on the operating temperature of the VGA 204. Particularly, the impedance or resistance across (i.e., from the collector to emitter of) the transistor 232 varies based on the operating temperature of the VGA 204, as the temperature in the region of the semiconductor die in which the VGA 204 is formed changes over time. With this change in impedance, the temperature profile voltage at the collector of the transistor 232 (i.e., at the node P) will also vary based on the operating temperature of the VGA 204, given the same current from the current source 230. The temperature sense circuit 20B is configured and operates similar to the temperature sense circuit 20B but measures the temperature of the VGA 208.

In another example of the temperature sense circuit 20A, the current source 230 can be implemented as a temperature-dependent current source, and the transistor 232 can be omitted. In this case, the temperature-dependent current source can be configured to provide current through the resistor R3 (or a resistor divider network including the resistor R3) based on the operating temperature of the VGA 204, and a voltage across the resistor R3 (or taken from another node in the resistor divider network) can be provided as the temperature profile voltage at the node P.

For complimentary control, the impedance of the transistor 232 is greater at lower operating temperatures and lesser at higher operating temperatures. Thus, in a complimentary control scheme, the temperature profile voltage at the node P will be larger at lower operating temperatures and smaller at higher operating temperatures. For a proportional control scheme, temperature profile generator 22 can be configured in a different way to provide a smaller temperature profile voltage at lower operating temperatures and a larger temperature profile voltage at higher operating temperatures.

The temperature profile voltage at the node P is provided to a non-inverting input of the difference amplifier 250. In turn, the difference amplifier 250 generates a temperature control signal 252 at the node A based on the temperature profile voltage. For the complimentary control scheme, the temperature control signal 252 will be larger for lower operating temperatures and smaller for higher operating temperatures of the VGA 204.

The reference generator 24 includes a reference current source 240 and a resistor R2. The reference current source 240 sources a current through the resistor R2, which is coupled at one end to Vss or ground. The Vref voltage across the resistor R2 is provided as input to a resistor divider network formed by resistors R3 and R4 and, in part, controls a scale position of the temperature profile of the temperature control signal 252 output by the difference amplifier 250, as described in further detail below with reference to FIG. 6. The reference current source 240 can be a fixed current reference source in one example. In another example, the reference current source 240 can be implemented as a temperature-dependent current source based on the operating temperature of the VGA 204. In other cases, the current sourced by the current source 240 can be adjusted based on other operating characteristics, parameters, or control of the amplifier 200.

The resistor divider network formed by resistors R3 and R4 sets a gain of the difference amplifier 250. The resistor R3 is coupled between the output of the difference amplifier 250 and the inverting input of the difference amplifier 250. The resistor R4 is coupled at one end to the inverting input of the difference amplifier 250 and at another end to a node between the reference current source 240 and the resistor R3. The resistor divider network sets a gain of the difference amplifier 250 and determines a slope of the temperature profile of the temperature control signal 252 at the node A, as described in further detail below with reference to FIG. 6. The resistances of the resistors R3 and R4 can be selected by design for a desired temperature profile of the temperature control signal 252. Alternatively, the resistances of one or both of the resistors R3 and R4 can be variable and varied during operation of the amplifier 200, to alter the slope of the temperature profile of the temperature control signal 252 during operation.

The temperature sense circuit 20A shown in FIG. 5 operates complementary to the absolute operating temperature of the VGA 204, because the temperature profile voltage at the node P is smaller for higher operating temperatures and larger for lower operating temperatures of the VGA 204 and is provided to the non-inverting input of the difference amplifier 250. In other cases, the temperature profile generator 22 can generate a proportional temperature profile voltage at the node P, and it can be coupled to the inverting input of the difference amplifier 250. Other variations of the temperature sense circuit 20A are within the scope of the embodiments.

FIG. 6 illustrates example temperature compensation profiles of the temperature sense circuit 20A shown in FIG. 5. Compensation profiles 260-262, which are representative of the voltage of the temperature control signal 252 over operating temperature of the VGA 240, are shown in FIG. 6. The slope of the compensation profile (e.g., the difference in the slope between the profiles 260 and 261) of the temperature sense circuit 20A can be altered by varying the divider network formed by resistors R3 and R4. The resistances of the resistors R3 and R4 can be selected for a desired compensation profile of the temperature control signal 252. In some cases, the resistances of one or both of the resistors R3 and R4 can be variable and varied during operation of the amplifier 200, to alter the slope of the compensation profiles of the temperature control signal 252 during operation.

The scale position of the compensation profile (e.g., the difference between the profiles 260 and 262) can also be altered. For example, the compensation profile 260 can be altered to the compensation profile 262 by varying the value of Vref in FIG. 5. Vref can be selected by design and fixed for a desired temperature profile of the temperature control signal 252, by selection of the current sourced by the reference current source 240, selection of the resistance of the resistor R2, or both.

FIG. 7 illustrates the converter 30A in the amplifier 200 shown in FIG. 4. The converter 30B can be implemented in a similar way. The converter 30A acts as a voltage to current converter, as described below. The converter 30A includes transistors 270, 272, 274, and 276, resistors R5, R6, and R7, and a capacitor C1 arranged as shown. The transistor 270 is embodied as a FET and the transistors are embodied as BJTs in the example shown, although other types of transistors can be relied upon. A source of the transistor 270 is coupled to Vcc, the gate of the transistor 270 is coupled to the temperature control signal 252 output from the difference amplifier 150 shown in FIG. 5, and the drain of the transistor 270 is coupled to the collector of the transistor 272. The emitter of the transistor 272 is coupled to ground or Vss through the resistor R5. The base of the transistor 272 is coupled to one end of the resistor R6. The transistor 274 is diode-connected between Vcc and a collector of the transistor 276. The base of the transistor 276 is coupled to a node between the drain of the transistor 270 and the collector of the transistor 272. The emitter of the transistor 276 is coupled to another end of the resistor R6 and the resistor R7 and the capacitor C1. The transistor 274 provides a voltage drop for DC biasing in the converter 30A, and the transistor 276 completes the current mirroring configuration for the converter 30A.

In operation, the converter 30A acts as a voltage to current converter and is configured as part of a current sourcing current mirror. The temperature control signal 252, which is applied to the gate of the transistor 270, directs the current sourcing operation of the converter 30A. An Iref current flows through the transistors 270 and 272 when the voltage of the temperature control signal 252 is greater than the threshold voltage of the transistor 270. The magnitude of Iref can be limited based on the resistance of R5, but the magnitude of Iref is proportional to the voltage of the temperature control signal 252. Thus, the converter 30A converts a voltage of the temperature control signal 252 into the Iref current. The Iref current in the converter 30A is mirrored to differential legs in the peaking shifter 206, as described below, for temperature-adaptive peaking gain control in the peaking shifter 206. The Iref current in the converter 30A is mirrored to the legs of the peaking shifter 206 based on a coupling of the potential at the node B to the peaking shifter 206. A similar reference current in the converter 30B is mirrored to the peaking shifter 210, for temperature-adaptive peaking gain control in the peaking shifter 210. The resistor R7 and capacitor C1 operate as a filter for the current mirror formed between the converter 30B and the peaking shifter 210.

Figure 8:
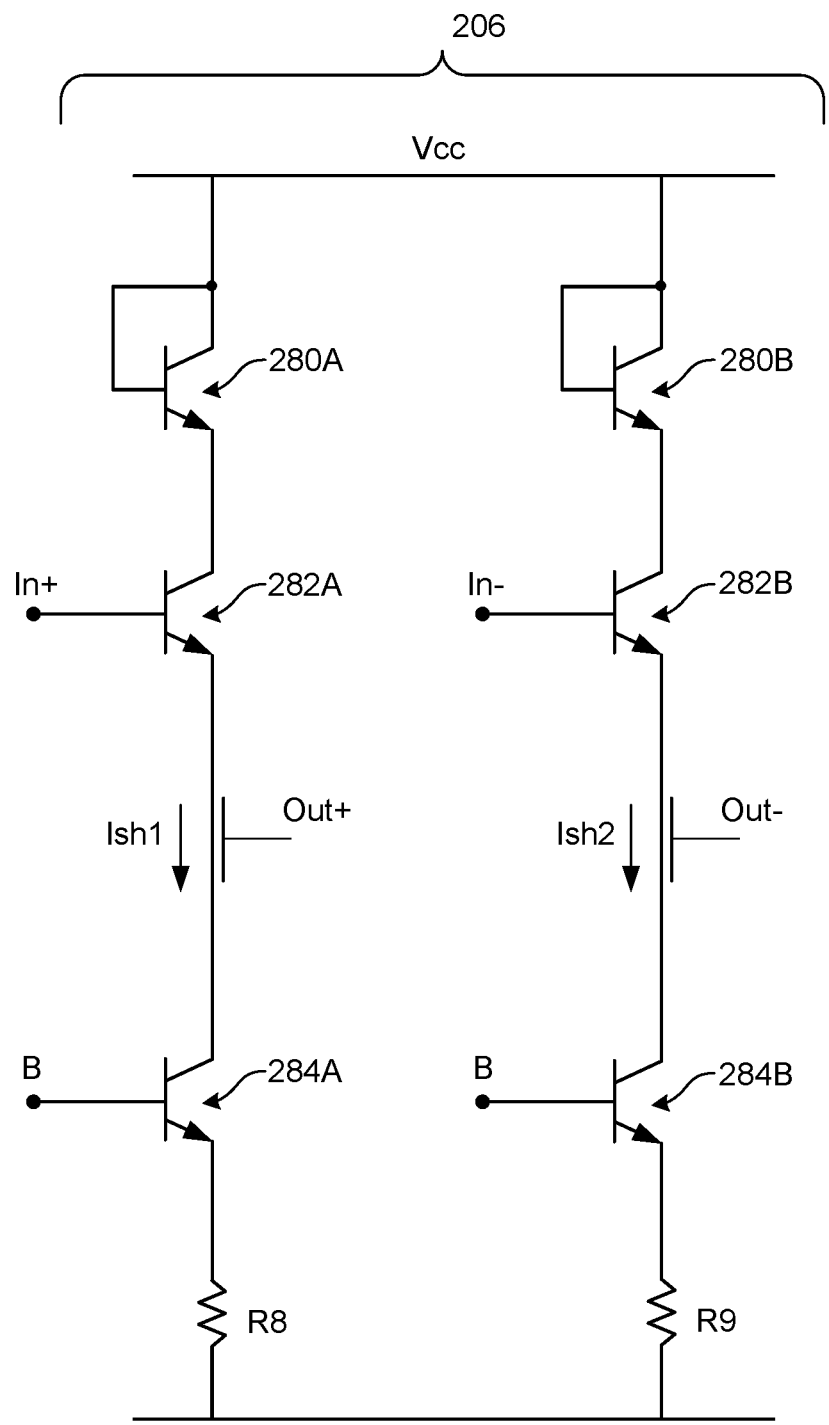
FIG. 8 illustrates a peaking shifter in the multi-stage amplifier shown in FIG. 4 according to certain aspects of the concepts described herein.

FIG. 8 illustrates the peaking shifter 206 in the amplifier 200 shown in FIG. 4. The peaking shifter 210 can be implemented in a similar way. The peaking shifter 206 includes two legs for the differential signal being amplified by the amplifier 200. In the first leg, the peaking shifter 206 includes transistors 280A, 282A, and 284A. In the second leg, the peaking shifter 206 includes transistors 280B, 282B, and 284B. The transistors 280A, 282A, 284A, 280B, 282B, and 284B can be embodied as BJTs, although other types of transistors can be relied upon.

The transistors 280A and 280B are diode-connected. The transistors 282A and 282B are configured as emitter-follower (i.e., common collector) transistor stages, below the transistors 280A and 280B. The In+ end of the differential signal being amplified by the amplifier 200 is applied at the base of the transistor 282A, and the In− end of the differential signal is applied at the base of the transistor 282B. An Out+ output of the peaking shifter 206 is coupled from a node between the transistors 282A and 284A, and an Out− output of the peaking shifter 206 is coupled from a node between the transistors 282B and 284B. The Out+ and Out− outputs are coupled to the inputs of the VGA 208 in the amplifier 200.

The DC bias points or voltages of the Out+ and Out− outputs are lower than the In+ and In− inputs, due to the base-to-emitter drops from Vcc across the diode-connected transistors 280A and 280B and the base-to-emitter drops across the transistors 282A and 282B. Thus, the peaking shifter 206 provides DC bias level shifting between the VGA 204 and 208. Additionally, the emitter-follower configuration of the transistors 282A and 282B results in a relatively small change in gain between the In+ and In− input signals and the Out+ and Out− output signals. The amount of gain will vary, however, based on the magnitudes of the currents Ish1 and Ish2 that flow through the legs of the peaking shifter 206. The peaking shifter 206 provides relatively more gain for larger Ish1 and Ish2 currents and less gain for smaller Ish1 and Ish2 currents.

The magnitudes of the currents Ish1 and Ish2 that flow through the legs of the peaking shifter 206 are temperature dependent according to aspects of the embodiments. A base of the transistor 284A and a base of the transistor 284B are each coupled to the node B in the converter 30A shown in FIG. 7. Thus, the two legs of the peaking shifter 206 operate in a current mirroring arrangement with the converter 30A. The Ish1 current in the first leg of the peaking shifter 206 mirrors the Iref current in the converter 30A, and the Ish2 current in the second leg of the peaking shifter 206 also mirrors the Iref current in the converter 30A. As such, when the Iref current in the converter 30A changes based on variations in the temperature of the VGA 204, as described above, the Ish1 and Ish2 currents in the peaking shifter 206 also mirror, follow, or track the change.

Based on the design of the temperature sense circuit 20A, the converter 30A, and the peaking shifter 206 in the example described, the Ish1 and Ish2 currents are smaller at lower operating temperatures and larger at higher operating temperatures of the VGA 204. With the corresponding variation in peaking gain provided by the peaking shifter 206 (e.g., more peaking gain for larger Ish1 and Ish2 currents and less peaking gain for smaller Ish1 and Ish2 currents), the peaking shifter 206 can alter the peaking gain of the amplifier 200 based on the temperature of the VGA 204. The peaking shifter 210 can also alter the peaking gain of the amplifier 200 based on the temperature of the VGA 208 in a similar way, in connection with the temperature sense circuit 20B and the converter 30B.

Figure 9:
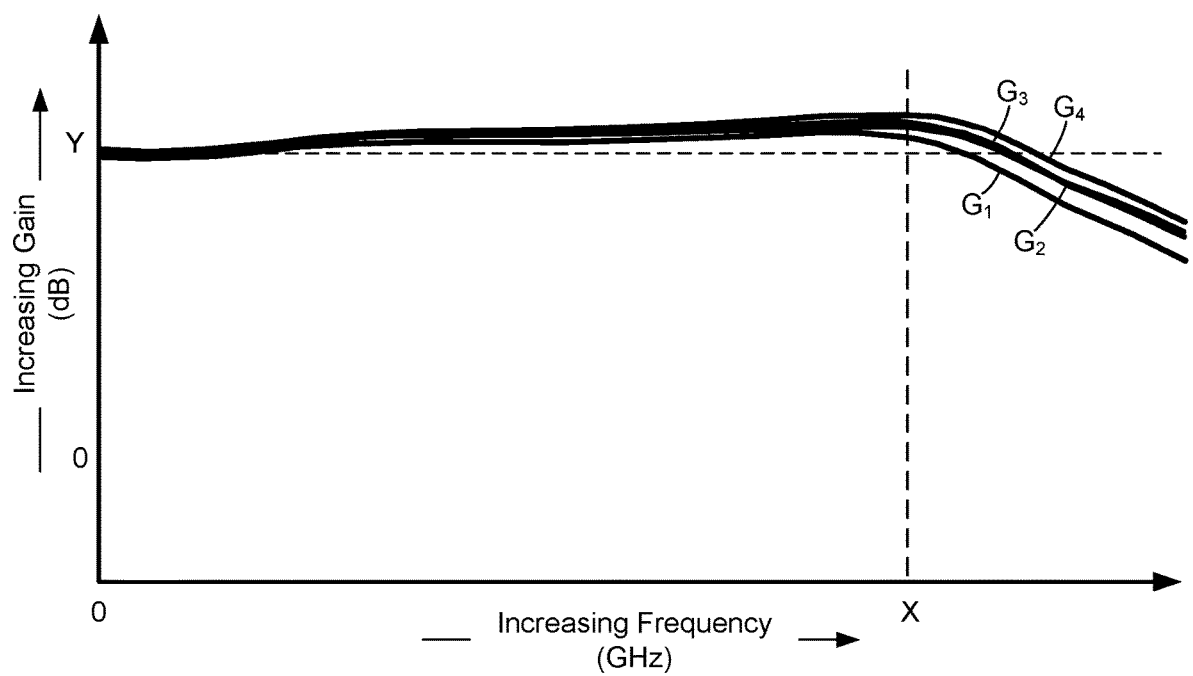
FIG. 9 illustrates a representative plot of power gain, across operating frequency, of the multi-stage amplifier shown in FIG. 4 according to certain aspects of the concepts described herein.

FIG. 9 illustrates a representative plot of power gain, across operating frequency, of the multi-stage amplifier 200 shown in FIG. 4. In FIG. 9, each of the curves $G_1$-$G_4$ illustrates the gain of the amplifier 200 across operating frequency, for a particular temperature. The curve $G_1$ was generated for an operating temperature of 95° C., and the curve $G_4$ was generated for an operating temperature of −5° C. The curves $G_2$ and $G_3$ were generated for operating temperatures between 95° C. and −5° C.

Comparing the curves $G_1$-$G_4$ in FIG. 9 to the curves $G_1$-$G_4$ in FIG. 3, each of the curves $G_1$-$G_4$ in FIG. 9 has a smaller increase in gain from low frequencies to the frequency "X" as compared to those in FIG. 3. The change in gain from low input frequencies to the frequency "X" is still the largest for the curve $G_4$, which is associated with the lowest operating temperature, but the peaking gain of the curve $G_4$ in FIG. 9 is less than that in FIG. 3. Overall, the amplifier 200 exhibits less peaking gain variation over all operating temperatures and particularly at higher operating temperatures. Thus, one aspect of the operation of the amplifier 200 according to the embodiments is to reduce the variation in peaking gain over temperature. The amplifier 200 is also designed, at least in part, to reduce the variation in peaking gain over temperature rather than to reduce it based on operating frequency or other operating characteristics beside temperature.

The amplifiers described herein can be embodied in hardware or simulated as a number of circuit elements in software. When simulated using software, each circuit element can be embodied as a module or listing of code associated with certain parameters to simulate the element. The software to simulate the circuit elements can include program instructions embodied in the form of, for example, source code that includes human-readable statements written in a programming language or machine code that includes machine instructions recognizable by a suitable execution system, such as a processor in a computer system or other system. If embodied in hardware, each element can represent a circuit or a number of electrically interconnected circuits.

One or more computing devices can execute the software to simulate the circuit elements that form the amplifiers described herein, among others. The computing devices can include at least one processing circuit. Such a processing circuit can include, for example, one or more processors and one or more storage or memory devices coupled to a local interface. The local interface can include, for example, a data bus with an accompanying address/control bus or any other suitable bus structure.

The storage or memory devices can store data or components that are executable by the processors of the processing circuit. For example, data associated with one or more circuit elements of the distributed amplifiers can be stored in one or more storage devices and referenced for processing by one or more processors in the computing devices. Similarly, the software to simulate the circuit elements and/or other components can be stored in one or more storage devices and be executable by one or more processors in the computing devices.

The transistors described herein can be formed using a number of different semiconductor materials and semiconductor manufacturing processes. Example semiconductor materials include the group IV elemental semiconductor materials, including Silicon (Si) and Germanium (Ge), compounds thereof, and the group III elemental semiconductor materials, including Aluminum (Al), Gallium (Ga), and Indium (In), and compounds thereof.

The optimizations in amplifiers can be applied to group III-V direct bandgap active semiconductor devices, such as transistors and amplifiers formed in SiGe semiconductor materials, amplifiers formed in III-Nitride (Aluminum (Al)—, Gallium (Ga)—, Indium (In)—, and their alloys (e.g., AlGaIn)) semiconductor materials, and GaAs, InP, InGaP, AlGaAs, and related semiconductor materials. The principles and concepts can also be applied to transistors and other active devices formed from other semiconductor materials.

The embodiments described herein are also applicable for use with amplifiers including GaN-on-Si transistors, among other types of transistors, but the embodiments can also be applied to GaN-on-Silicon Carbide (SiC) transistors, as well as other types of transistors. As used herein, the phrase "gallium nitride material" or GaN semiconductor material refers to gallium nitride and any of its alloys, such as aluminum gallium nitride ($Al_xGa_{(1-x)}N$), indium gallium nitride ($In_yGa_{(1-y)}N$), aluminum indium gallium nitride ($Al_xIn_y\,Ga_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), among others. Typically, when present, arsenic and/or phosphorous are at low concentrations (e.g., less than 5 weight percent). The term "gallium nitride" or GaN semiconductor refers directly to gallium nitride, exclusive of its alloys.

The features, structures, and components described above may be combined in one or more embodiments in any suitable manner, and the features discussed in the various embodiments are interchangeable where technically suitable. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "on," "below," "upper," "lower," "top," "bottom," "right," and "left" may be used to describe the relative spatial relationships of certain structural features, these terms are used for convenience only, as a direction in the examples. It should be understood that if the device is turned upside down, the "upper" component will become a "lower" component. When a structure or feature is described as being "over" (or formed over) another structure or feature, the structure can be positioned over the other structure, with or without other structures or features intervening between them. When two components are described as being "connected to" or "coupled to" each other, the components can be electrically connected or coupled to each other, with or without other components being electrically coupled and intervening between them. When two components are described as being "directly connected to" or "directly coupled to" each other, the components can be electrically connected or coupled to each other, without other components being electrically coupled between them. Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A semiconductor device with temperature-adaptive control, comprising:
   an amplifier to provide an amplified output signal;
   a temperature sense circuit to provide a temperature control signal based on an operating temperature of the amplifier; and
   a peaking control level shifter to bias shift the output of the amplifier and to adjust a peaking gain of the amplifier based on the temperature control signal.

2. The semiconductor device of claim 1, wherein the temperature control signal comprises a temperature reference voltage representative of the operating temperature of the amplifier.

3. The semiconductor device of claim 2, further comprising a converter to convert the temperature reference voltage to a temperature reference current and to provide the temperature reference current to the peaking control level shifter.

4. The semiconductor device of claim 3, wherein the peaking control level shifter mirrors the temperature reference current to adjust the peaking gain of the amplifier.

5. The semiconductor device of claim 3, wherein the converter and the peaking control level shifter comprise a current mirror.

6. The semiconductor device of claim 3, wherein the peaking control level shifter comprises:
   an emitter follower transistor to bias shift the output of the amplifier; and
   a transistor having a base coupled to the converter to mirror the temperature reference current.

7. The semiconductor device of claim 1, wherein the temperature sense circuit comprises:
   a temperature dependent impedance network to provide a temperature profile voltage based on the operating temperature of the amplifier; and
   a difference amplifier to provide the temperature control signal based on the temperature profile voltage.

8. The semiconductor device of claim 7, wherein the temperature sense circuit further comprises:
   a resistor voltage divider coupled between an output of the difference amplifier and an input of the difference amplifier, the resistor voltage divider setting a slope of a temperature profile of the temperature sense circuit; and
   a reference generator to provide a reference voltage to the resistor voltage divider.

9. The semiconductor device of claim 8, wherein the reference voltage sets a scale position of the temperature profile of the temperature sense circuit.

10. The semiconductor device of claim 1, wherein the amplifier comprises a variable gain amplifier.

11. The semiconductor device of claim 1, wherein:
    the amplifier comprises a differential variable gain amplifier; and
    the peaking control level shifter comprises a differential peaking control level shifter.

12. The semiconductor device of claim 1, further comprising:
    a second amplifier;
    a second temperature sense circuit to provide a second temperature control signal based on an operating temperature of the second amplifier; and a second peaking control level shifter to bias shift an output of the second amplifier and to adjust a peaking gain of the second amplifier based on the second temperature control signal.

13. The semiconductor device of claim 12, wherein:

the peaking control level shifter is coupled between the amplifier and the second amplifier; and the second peaking control level shifter is coupled between the second amplifier and an output of the semiconductor device.

14. A multi-stage semiconductor device with temperature-adaptive control, comprising:

a first amplifier;

a second amplifier;

a temperature sense circuit to provide a temperature control signal; and a peaking control level shifter coupled between an output of the first amplifier and an input of the second amplifier, wherein the peaking control level shifter adjusts a peaking gain of the multi-stage semiconductor device based on the temperature control signal.

15. The multi-stage semiconductor device of claim 14, further comprising a converter to convert a temperature reference voltage to a temperature reference current, wherein the peaking control level shifter mirrors the temperature reference current to adjust the peaking gain of the multi-stage semiconductor device.

16. The multi-stage semiconductor device of claim 15, wherein the converter and the peaking control level shifter comprise a current mirror.

17. The multi-stage semiconductor device of claim 15, wherein the peaking control level shifter comprises:

an emitter follower transistor to bias shift an output of the first amplifier; and a transistor having a base coupled to the converter to mirror the temperature reference current.

18. The multi-stage semiconductor device of claim 14, wherein the temperature sense circuit comprises:

a temperature dependent impedance network to provide a temperature profile voltage based on an operating temperature of the multi-stage semiconductor device; and a difference amplifier to provide the temperature control signal based on the temperature profile voltage.

19. The multi-stage semiconductor device of claim 18, wherein the temperature sense circuit further comprises:

a resistor voltage divider coupled between an output of the difference amplifier and an input of the difference amplifier, the resistor voltage divider setting a slope of a temperature profile of the temperature sense circuit; and a reference generator to provide a reference voltage to the resistor voltage divider based on the second current.

20. The multi-stage semiconductor device of claim 19, further comprising:

a second temperature sense circuit to provide a second temperature control signal; and a second peaking control level shifter to bias shift an output of the second amplifier and to adjust a peaking gain of the second amplifier based on the second temperature control signal.

* * * * *